United States Patent
Saito

(10) Patent No.: US 9,099,564 B2
(45) Date of Patent: Aug. 4, 2015

(54) NITRIDE SEMICONDUCTOR ELEMENT WITH SELECTIVELY PROVIDED CONDUCTIVE LAYER UNDER CONTROL ELECTRODE

(71) Applicant: Kabushiki Kaisha Toshiba, Tokyo (JP)

(72) Inventor: Wataru Saito, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 14/097,342

(22) Filed: Dec. 5, 2013

(65) Prior Publication Data
US 2014/0103395 A1 Apr. 17, 2014

Related U.S. Application Data

(62) Division of application No. 13/234,943, filed on Sep. 16, 2011, now Pat. No. 8,624,265.

(30) Foreign Application Priority Data

Jan. 26, 2011 (JP) .................. 2011-014279

(51) Int. Cl.
*H01L 29/808* (2006.01)
*H01L 29/06* (2006.01)
(Continued)

(52) U.S. Cl.
CPC .......... *H01L 29/808* (2013.01); *H01L 29/0623* (2013.01); *H01L 29/1075* (2013.01);
(Continued)

(58) Field of Classification Search
CPC .............. H01L 29/808; H01L 29/7787; H01L 29/4175; H01L 29/1075; H01L 29/0623; H01L 29/1087; H01L 29/402; H01L 29/2003; H01L 29/205

USPC .......................................................... 257/76
See application file for complete search history.

(56) References Cited

U.S. PATENT DOCUMENTS 6,307,232 B1 10/2001 Akiyama et al.
6,476,431 B1 11/2002 Ohno et al.
(Continued)

FOREIGN PATENT DOCUMENTS

JP  2005093864 A  4/2005
JP  2009152353 A  7/2009
(Continued)

OTHER PUBLICATIONS

Japanese Office Action dated May 30, 2014, filed in Japanese counterpart Application No. 2011-014279, 9 pages (with translation).
(Continued)

*Primary Examiner* — Eva Y Montalvo
*Assistant Examiner* — Grant Withers
(74) *Attorney, Agent, or Firm* — Patterson & Sheridan, LLP

(57) ABSTRACT

According to one embodiment, the semiconductor element includes a semi-insulating substrate which has a first first-conductivity-type layer. The semiconductor element includes a first semiconductor layer. The first semiconductor layer contains non-doped $Al_XGa_{1-X}N$ ($0 \le X < 1$). The semiconductor element includes a second semiconductor layer. The second semiconductor layer contains non-doped or second-conductivity-type $Al_YGa_{1-Y}N$ ($0 < Y \le 1$ and $X < Y$)). The semiconductor element includes a first major electrode and a second major electrode. The semiconductor element includes a control electrode provided on the second semiconductor layer between the major electrodes. And the first first-conductivity-type layer is provided under the control electrode.

12 Claims, 11 Drawing Sheets

(51) Int. Cl.
*H01L 29/10* (2006.01)
*H01L 29/417* (2006.01)
*H01L 29/778* (2006.01)
H01L 29/20 (2006.01)
H01L 29/40 (2006.01)

(52) U.S. Cl.
CPC ........ *H01L29/1087* (2013.01); *H01L 29/4175* (2013.01); *H01L 29/7787* (2013.01); *H01L 29/2003* (2013.01); *H01L 29/402* (2013.01)

(56) References Cited

U.S. PATENT DOCUMENTS

| | | | |
|---|---|---|---|
| 7,075,125 B2 * | 7/2006 | Saito et al. | 257/194 |
| 7,078,743 B2 | 7/2006 | Murata et al. | |
| 7,250,641 B2 | 7/2007 | Saito et al. | |
| 7,339,207 B2 | 3/2008 | Murata et al. | |
| 7,498,618 B2 | 3/2009 | Saito et al. | |
| 7,759,700 B2 | 7/2010 | Ueno et al. | |
| 2005/0116302 A1 | 6/2005 | Kamo et al. | |
| 2006/0011915 A1 | 1/2006 | Saito et al. | |
| 2007/0051977 A1 | 3/2007 | Saito et al. | |
| 2007/0200143 A1 * | 8/2007 | Saito et al. | 257/192 |
| 2008/0116486 A1 * | 5/2008 | Saito et al. | 257/192 |
| 2008/0247214 A1 * | 10/2008 | Ufert | 365/148 |
| 2009/0008679 A1 | 1/2009 | Saito | |
| 2010/0230717 A1 | 9/2010 | Saito | |
| 2010/0314666 A1 | 12/2010 | Saito et al. | |
| 2011/0272708 A1 | 11/2011 | Yoshioka et al. | |
| 2012/0025205 A1 | 2/2012 | Nakata et al. | |
| 2012/0025206 A1 | 2/2012 | Nakata et al. | |
| 2012/0138958 A1 | 6/2012 | Fujikawa | |
| 2012/0153300 A1 | 6/2012 | Lidow et al. | |
| 2012/0205667 A1 | 8/2012 | Simin et al. | |

FOREIGN PATENT DOCUMENTS

| | | |
|---|---|---|
| JP | 2010109086 A | 5/2010 |
| JP | 2011168111 A | 9/2011 |

OTHER PUBLICATIONS

Chinese Office Action dated Sep. 9, 2014, filed in Chinese counterpart Application No. 201110249455.3, 8 pages (with translation).
Japanese Office Action dated Feb. 19, 2015, filed in Japanese counterpart Application No. 2011-014279, 4 pages (with translation).

* cited by examiner

NITRIDE SEMICONDUCTOR ELEMENT WITH SELECTIVELY PROVIDED CONDUCTIVE LAYER UNDER CONTROL ELECTRODE

CROSS-REFERENCE TO RELATED APPLICATIONS

This application is a division of U.S. patent application Ser. No. 13/234,943, filed on Sep. 16, 2011, which is based upon and claims the benefit of priority from the prior Japanese Patent Application No. 2011-014279, filed on Jan. 26, 2011, the entire contents of each of which are incorporated herein by reference.

FIELD

Embodiments described herein relate generally to a semiconductor element.

BACKGROUND

An element using the wide-band-gap semiconductor attracts attention as a circuit element such as switching power supply and an inverter. Such an element includes a hetero-junction field effect transistor (HFET) having a hetero-structure of aluminum gallium nitride (AlGaN)/gallium nitride (GaN), for example, as a device easily to have a low ON-resistance. The HFET realizes the low ON-resistance by a high mobility in a hetero-interface channel and a high electron density generated by piezo-polarization.

However, when a high voltage is applied between a gate and a drain of the HFET, electric field concentration occurs at an edge part of the gate electrode. Electrons accelerated by this electric field concentration jump into a passivation film or an AlGaN layer. As a result, the electrons are trapped in the passivation film or the AlGaN layer. It is difficult to release the trapped electrons even when the HFET comes to have an ON-state and the applied voltage across the gate and the drain is reduced.

The electron trapping depletes the hetero-interface channel partially. As a result, there is a possibility that the ON-resistance is increased in the HFET. Such a phenomenon is referred to as a current collapse phenomenon. To suppress the current collapse phenomenon realizes the low ON-resistance effectively. Furthermore, when the electrons jump into the passivation film or the AlGaN layer, defects are generated in the passivation film or the AlGaN layer. Thereby, the variation in HFET characteristics, that is, reliability deterioration is caused.

A measure to reduce the electric field at the edge part of the gate electrode includes employment of a field plate (FP) structure. For example, a substrate FP electrode is formed by way of using a conductive substrate as a support substrate and connecting the conductive substrate to the source electrode. However, when the substrate FP electrode is employed, a high voltage is applied also across a semiconductor layer between the support substrate and the drain electrode. Accordingly, for realizing a high breakdown voltage, it is necessary to increase the thickness of a semiconductor layer between the support substrate and the drain electrode. Therefore, a spatial distance is increased between the support substrate and the gate electrode and a shield effect of the substrate FP electrode becomes weak. That is, in the HFET, when the electric field at the edge part of the gate electrode is increased, there is a possibility that the low ON-resistance and the high reliability are not obtained.

DETAILED DESCRIPTION

Figure 1A:
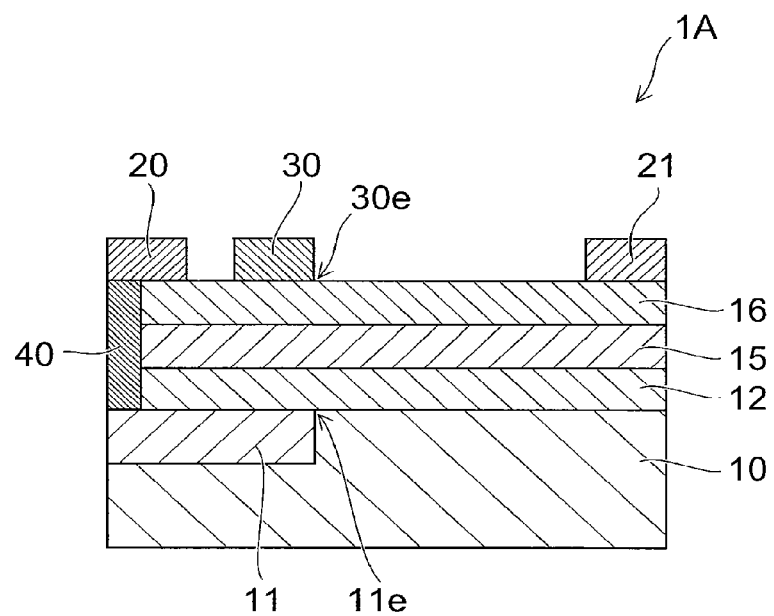
FIGS. 1A and 1B are schematic views of a semiconductor element according to a first embodiment.

In general, according to one embodiment, a semiconductor element is disclosed. The semiconductor element can include a semi-insulating substrate which has a first first-conductivity-type layer selectively on a surface of the semi-insulating substrate. The semiconductor element can include a first semiconductor layer which is provided on the semi-insulating substrate and the first first-conductivity-type layer. The first semiconductor layer contains non-doped $Al_XGa_{1-X}N$ ($0 \leq X < 1$). The semiconductor element can include a second semiconductor layer which is provided on the first semiconductor layer. The second semiconductor layer contains non-doped or second-conductivity-type $Al_YGa_{1-Y}N$ ($0 < Y \leq 1$ and $X < Y$)). The semiconductor element can include a first major electrode which is connected to the second semiconductor layer. The semiconductor element can include a second major electrode which is connected to the second semiconductor layer. The semiconductor element can include a control electrode which is provided on the second semiconductor layer between the first major electrode and the second major electrode. And the first first-conductivity-type layer is provided under the control electrode.

Hereinafter, embodiments will be described with reference to the accompanying drawings. In the drawings shown below, like components are marked with like reference numerals.

(First Embodiment)

Figure 1B:
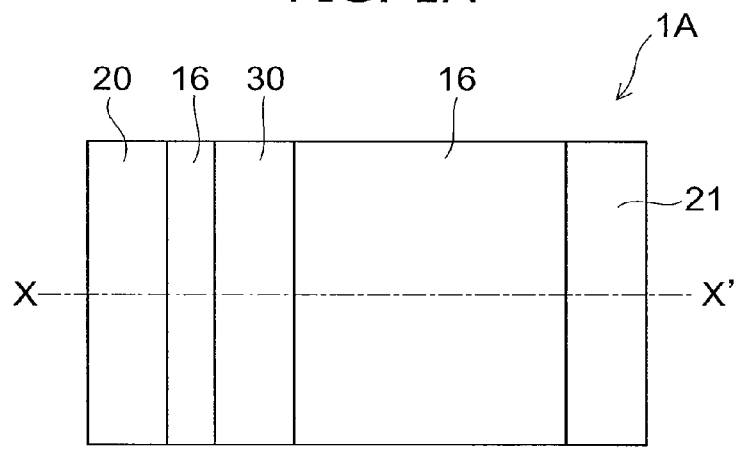

FIGS. 1A and 1B are schematic views of a semiconductor element according to a first embodiment, and FIG. 1A is a schematic cross-sectional view of the relevant part and FIG. 1B is a schematic plan view of the relevant part. FIG. 1A shows an X-X' cross section of FIG. 1B.

The semiconductor element 1A is a HFET element. In the semiconductor element 1A, semiconductor layers are stacked on a support substrate 10 which is a semi-insulating substrate. Each of the semiconductor layers is formed by an epitaxial growth method, for example.

In the semiconductor element 1A, a p-type layer 11 of a first first-conductivity-type layer is provided selectively on the surface of the support substrate 10. The p-type layer 11 also may be called a p-type embedded layer or a p-type doped layer. A buffer layer 12 is provided on the support substrate 10 and the p-type layer 11. A channel layer 15 of a first semiconductor layer is provided on the buffer layer 12. A barrier layer 16 of a second semiconductor layer is provided on the channel layer 15.

A source electrode 20 of a first major electrode is connected to the barrier layer 16. A drain electrode 21 of a second major electrode is connected to the barrier layer 16. A gate electrode 30 of a control electrode is provided on the barrier layer 16 between the source electrode 20 and the drain electrode 21. The p-type layer 11 is provided under the gate electrode 30. An edge 11e of the p-type layer 11 is not positioned directly under the drain electrode 21. For example, in the X-X' cross section, the edge 11e of the p-type layer 11 on the drain electrode 21 side is positioned directly under an edge 30e of the gate electrode 30 on the drain electrode 21 side.

The gate electrode 30 is connected to the barrier layer 16 with a Schottky junction. The p-type layer 11 electrically connected to the source electrode 20 via a contact layer 40. The source electrode 20 and the contact layer 40 are not always formed as different members from each other and the contact layer 40 may be included in the source electrode 20 to be formed as one major electrode. This is the same in the embodiments shown below.

Each of the source electrode 20 and the drain electrode 21 has a stripe shape in the plane of the semiconductor element 1A. The gate electrode 30 has a stripe shape in the plane of the semiconductor element 1A. The gate electrode 30 extends in the same direction as the source electrode 20 and the drain electrode 21.

The support substrate 10 is a semi-insulating substrate. The material of the support substrate 10 contains silicon carbide (SiC), for example.

The material of the buffer layer 12 contains aluminum nitride (AlN), for example.

The material of the channel layer 15 contains non-doped aluminum gallium nitride ($Al_xGa_{1-x}N$ ($0 \leq X < 1$)), for example.

The material of the barrier layer 16 contains non-doped or n-type aluminum gallium nitride ($Al_YGa_{1-Y}N$ ($0 < Y \leq 1$ and $X < Y$)), for example.

The material of the p-type layer 11 contains p-type silicon carbide (SiC), for example. The p-type layer 11 is formed by ion implantation into the support substrate 10, for example. The impurity concentration in the p-type layer 11 is not lower than $1 \times 10^{16}$ (atoms/cm$^3$), for example. A metal layer or an n-type layer such as one which does not cause electron leak may be disposed at the p-type layer part instead of the p-type layer 11.

A foundation for the growth of the buffer layer 12 (i.e., support substrate 10 or p-type layer 11) is required to have a high flatness and constituent uniformity. Accordingly, in the support substrate 10, the p-type layer 11 may be provided inside the support substrate 10 and a non-doped silicon carbide layer may be exposed on the side of the buffer layer 12. The position of the p-type layer 11 in the depth direction is adjusted by the control of ion acceleration energy in the ion implantation.

Successively, an advantage of the semiconductor element 1A will be explained. Before the advantage of the semiconductor element 1A is explained, an operation of a semiconductor element 100 according to a reference example will be explained.

Figure 2A:
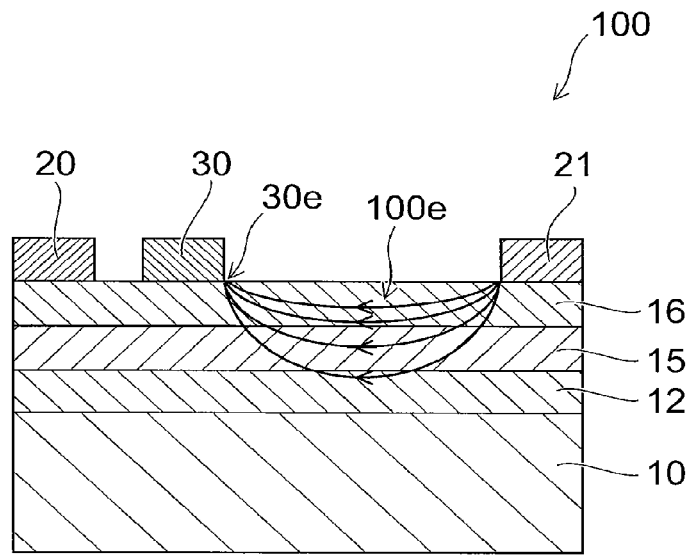
FIGS. 2A and 2B are schematic views of semiconductor elements according to the reference example and the embodiment, respectively.
Figure 2B:
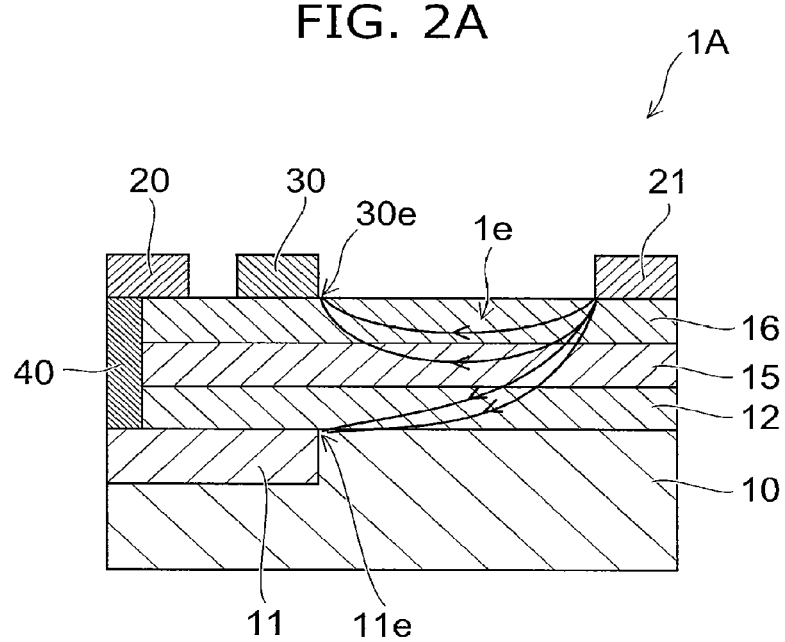

FIGS. 2A and 2B are schematic views of semiconductor elements according to the reference example and the embodiment, respectively. FIG. 2A shows a cross section of the relevant part of the semiconductor element according to the reference example, and FIG. 2B shows a cross section of the relevant part of the semiconductor element according to the embodiment.

The p-type layer 11 or the contact layer 40 is not provided in the semiconductor element 100 shown in FIG. 2A.

When a high voltage is applied between a source electrode 20 and a drain electrode 21 of the semiconductor element 100, a high electric field is generated also between a gate electrode 30 and the drain electrode 21. Thereby, an electric field is concentrated at an edge part of the gate electrode 30. For example, the drawing illustrates a plurality of electric force lines 100e directed from the drain electrode 21 to the edge 30e of the gate electrode 30. The edge part of the gate electrode 30 indicates the edge 30e or a part near this edge 30e.

Electrons are accelerated by this high electric field in a hetero-interface channel between a barrier layer 16 and a channel layer 15. Then, the electrons are trapped by crystal defects on the surface of the barrier layer 16, in the barrier layer 16, and in the channel layer 15. Thereby, the current collapse phenomenon easily occurs in the semiconductor element 100.

In the semiconductor element 100, since the high energy electrons jump into an insulating film (not shown in the drawing) provided on the barrier layer 16, insulation deterioration of the insulating film is caused easily. Furthermore, since the high energy electrons jump into the barrier layer 16 and the channel layer 15, there is a possibility that a new crystal defect is generated in the barrier layer 16 and the channel layer 15. Thereby, the reliability of the semiconductor element 100 is deteriorated.

In contrast, in the semiconductor element 1A shown in FIG. 2B, the p-type layer 11 is provided selectively on the surface of the support substrate 10 under the gate electrode 30. When a high voltage is applied between the source electrode 20 and the drain electrode 21 of the semiconductor element 1A in such a state, an electric field is concentrated also at an edge part of the p-type layer 11 on the side of the drain electrode 21 not limited to the edge part of the gate electrode 30 near the drain electrode 21. For, example, the drawing illustrates a plurality of electric force lines 1e directed from the drain electrode 21 to the edge 30e of the gate electrode 30 or the edge 11e of the p-type layer 11. The edge part of the p-type layer 11 indicates the edge 11e or a part near this edge 11e.

That is, when the high electric field is applied between the source electrode 20 and the drain electrode 21, the electric field is dispersed by the edge part of the gate electrode 30 and the edge part of the p-type layer 11. Furthermore, since the support substrate 10 is a semi-insulating substrate, the electric field from the drain electrode 21 can be dispersed into the support substrate 10. Thereby, in the semiconductor element 1A, the electric field near the hetero-interface is suppressed as compared with the semiconductor element 100. As a result, the electron acceleration is slowed down in the semiconductor element 1A as compared with the semiconductor element 100. That is, in the semiconductor element 1A, the current collapse phenomenon does not occur easily as compared with the semiconductor element 100.

Furthermore, in the semiconductor element 1A, the electrons do not jump easily into the insulating film provided on the barrier layer 16, the barrier layer 16, and the channel layer as compared with the semiconductor element 100. Accordingly, the semiconductor element 1A has a higher reliability than the semiconductor element 100.

In the semiconductor element 1A, the electric field concentration can be reduced at the edge part of the gate electrode 30 by way of using a conductive substrate as the support substrate 10 and connecting this conductive substrate to the source electrode 20 (field plate effect (FP effect)). The current collapse phenomenon is suppressed by such a structure.

However, in such a structure, a high voltage is applied between the conductive substrate and the drain electrode 21 which face each other. Therefore, it is necessary to increase the thickness of the channel layer 15 and the like for obtaining a high breakdown voltage. As the channel layer 15 is made thicker, the distance between the support substrate 10 and the gate electrode 30 is increased and the field plate effect is reduced. Furthermore, when the semiconductor layer such as the channel layer 15 and the like has a larger thickness, the semiconductor element 100 is bended and invites cost increase.

In contrast, when an insulating substrate is used as the support substrate 10, the electric field concentration is not reduced at the edge part of the gate electrode 30 and there is a possibility that the current collapse phenomenon occurs easily, while the high breakdown voltage is maintained. That is, there arises a trade-off when the conductive substrate or the insulating substrate is used as the support substrate 10.

In the semiconductor element 1A according to the embodiment, this trade-off can be dissolved through the use of the semi-insulating support substrate 10 provided with the p-type layer 11.

That is, in the semiconductor element 1A, the p-type layer 11 is formed on the surface of the support substrate 10. Therefore, the high breakdown voltage can be maintained without the thickness increase in at least any one of the buffer layer 12, the channel layer 15, and the barrier layer 16. Furthermore, it is not necessary to increase the thickness in at least any one of the buffer layer 12, the channel layer 15, and the barrier layer 16. As a result, the distance between a two-dimensional electron gas channel and the support substrate 10 is reduced and thermal resistance is also reduced. Thereby, the temperature rise of the element becomes difficult to occur. As a result, the semiconductor element 1A easily realizes a high current operation and a high temperature operation.

Furthermore, since the p-type layer 11 is electrically connected to the source electrode 20, holes generated at the time of avalanche breakdown can be ejected to the source electrode 20 via the p-type layer 11. Thereby, the semiconductor element 1A can realize a high avalanche withstand capability.

(Variation Example of the First Embodiment)

Figure 3:
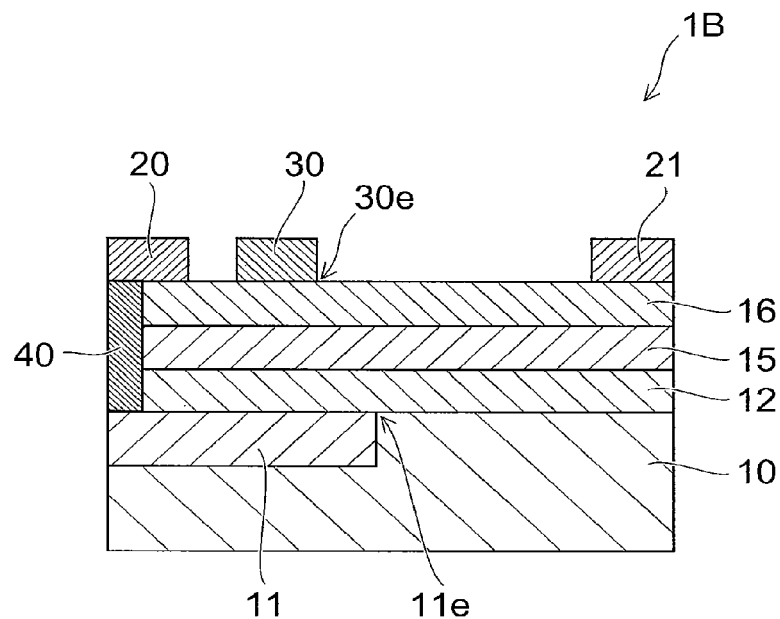
FIG. 3 is a schematic cross-sectional view of a semiconductor element according to a variation example of the first embodiment.

FIG. 3 is a schematic cross-sectional view of a semiconductor element according to a variation example of the first embodiment.

In the semiconductor element 1B, the p-type layer 11 extends from the gate electrode 30 to the drain electrode 21 side. In the semiconductor element 1B, the edge 11e of the p-type layer 11 on the drain electrode 21 side is positioned between the gate electrode 30 and the drain electrode 21 when viewed in the direction perpendicular to a major surface of the support substrate 10. That is, the edge 11e of the p-type layer 11 in the semiconductor element 1B is positioned closer to the drain electrode 21 side than the edge 11e of the p-type layer 11 in the semiconductor element 1A.

In such a structure, when a high voltage is applied between the source electrode 20 and the drain electrode 21, the electric field is concentrated preferentially at the edge part of the p-type layer 11. Thereby, in the semiconductor element 1B, the electric field concentration at the edge part of the gate electrode 30 is further reduced as compared with the semiconductor element 1A. As a result, in the semiconductor element 1B, the current collapse is further suppressed as compared with the semiconductor element 1A.

The p-type layer 11 is positioned between the support substrate 10 and the buffer layer 12, and thus the electric field is stronger within the semiconductor layer than on the element surface. As a result, the avalanche breakdown does not occur easily on the element surface and a higher avalanche withstand capability and reliability are obtained.

(Second Embodiment)

Figure 4:
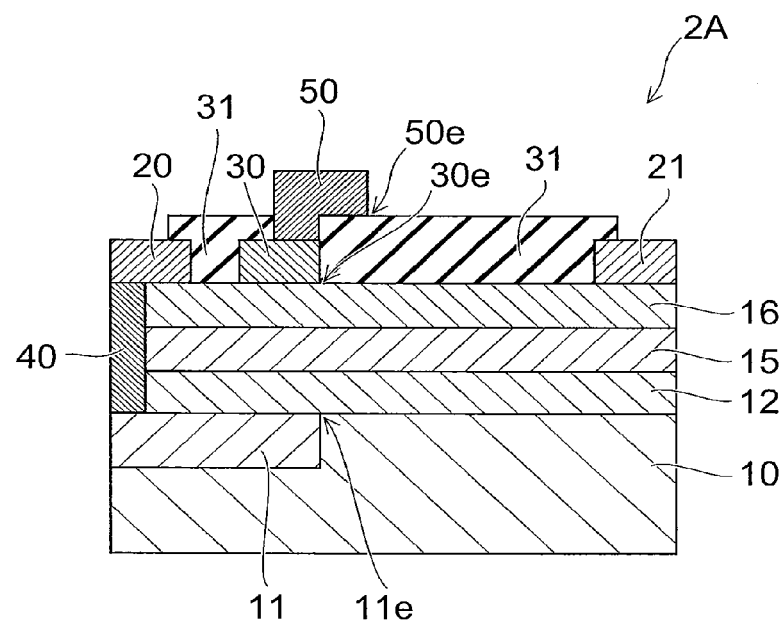
FIG. 4 is a schematic cross-sectional view of a semiconductor element according to a second embodiment.

FIG. 4 is a schematic cross-sectional view of semiconductor element according to a second embodiment.

In the semiconductor element 2A, a passivation film 31 of a first insulating film is provided on the barrier layer 16 except the gate electrode 30, the source electrode 20, and the drain electrode 21. The material of the passivation film 31 is silicon oxide ($SiO_2$), silicon nitride ($Si_3N_4$), or the like, for example.

A gate field plate electrode 50 of a first field plate electrode is provided on the passivation film 31. The gate field plate electrode 50 is electrically connected to the gate electrode 30. The gate field plate electrode 50 extends to the drain electrode 21 side on the passivation film 31. The edge 11e of the p-type layer 11 on the drain electrode 21 side is positioned directly under the edge 30e of the gate electrode 30 on the drain electrode 21 side.

In such a structure, when a high voltage is applied between the source electrode 20 and the drain electrode 21, the electric field is concentrated also at an edge 50e of the gate field plate electrode 50. As a result, in the semiconductor element 2A, the electric field concentration at the edge part of the gate electrode 30 is further reduced as compared with the semiconductor element 1A. Accordingly, in the semiconductor element 2A, ON-resistance increase due to the current collapse and the reliability deterioration are further suppressed as compared with the semiconductor element 1A.

(First Variation Example of the Second Embodiment)

Figure 5:
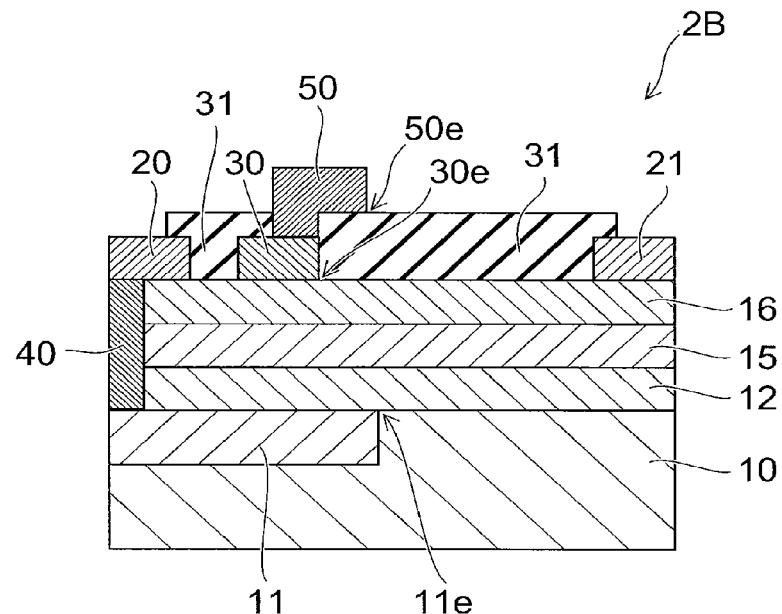
FIG. 5 is a schematic cross-sectional view of a semiconductor element according to a first variation example of the second embodiment.

FIG. 5 is a schematic cross-sectional view of a semiconductor element according to a first variation example of the second embodiment.

In the semiconductor element 2B, the passivation film 31 is provided on the barrier layer 16. The gate field plate electrode 50 is provided on the passivation film 31. The gate field plate electrode 50 is electrically connected to the gate electrode 30. The gate field plate electrode 50 extends to the drain electrode 21 side on the passivation film 31.

Furthermore, the edge 11e of the p-type layer on the drain electrode 21 side is positioned between the gate field plate electrode 50 and the drain electrode 21 when viewed in the direction perpendicular to the major surface of the support substrate 10. That is, the edge 11e of the p-type layer 11 in the semiconductor element 2B is positioned closer to the drain electrode 21 side than the edge 11e of the p-type layer 11 in the semiconductor element 2A.

In such a structure, when a high voltage is applied between the source electrode 20 and the drain electrode 21, the electric field is concentrated preferentially at the edge part of the p-type layer 11. Thereby, in the semiconductor element 2B, the electric field at the edge part of the gate electrode 30 is further reduced as compared with the semiconductor element 2A. As a result, in the semiconductor element 2B, the current collapse is further suppressed as compared with the semiconductor device 2A.

Since the p-type layer 11 is positioned between the support substrate 10 and the buffer layer 12, the electric field is stronger within the semiconductor layer than on the surface of the element surface. As a result, the avalanche breakdown does not occur easily on the element surface, and a higher avalanche withstand capability and reliability are obtained.

(Second Variation Example of the Second Embodiment)

Figure 6:
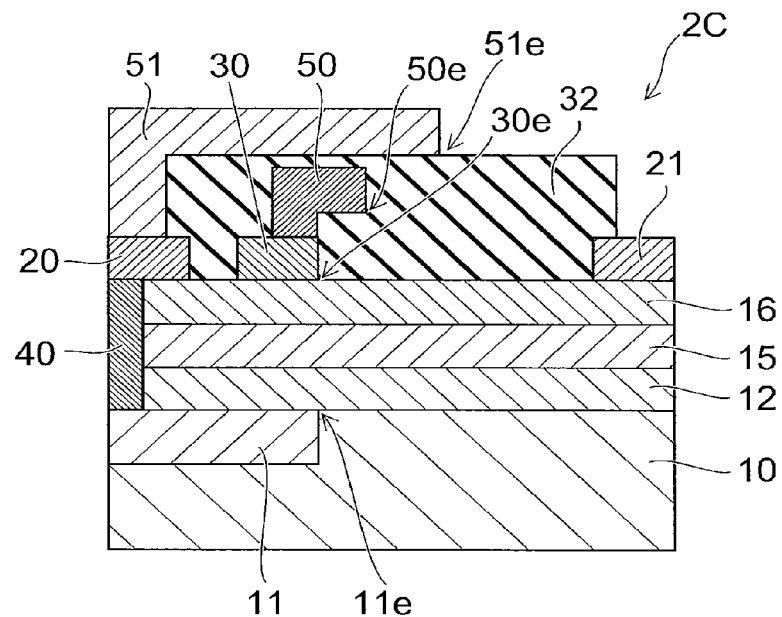
FIG. 6 is a schematic cross-sectional view of a semiconductor element according to a second variation example of the second embodiment.

FIG. 6 is a schematic cross-sectional view of a semiconductor element according to a second variation example of the second embodiment.

In the semiconductor element 2C, a passivation film 32 covering the gate field plate electrode 50 is provided on the barrier layer 16. The passivation film 32 is a second insulating film in the embodiment. The material of the passivation film 32 is silicon oxide ($SiO_2$), silicon nitride ($Si_3N_4$), or the like, for example.

A source field plate electrode 51 is provided on the gate field plate electrode 50 via the passivation film 32. The source field plate electrode 51 is a second field plate electrode in the embodiment. The source field plate electrode 51 is electrically connected to the source electrode 20. The source field plate electrode 51 extends from the source electrode 20 to the drain electrode 21 side. An edge 51e of the source field plate electrode 51 is positioned further closer to the drain electrode 21 than the edge 50e of the gate field plate electrode 50. The edge 11e of the p-type layer 11 on the side of the drain electrode 21 is positioned directly under the edge 30e of the gate electrode 30 on the side of the drain electrode 21.

In such a structure, when a high voltage is applied between the source electrode 20 and the drain electrode 21, the electric field is concentrated also at the edge 51e of the source field plate electrode 51. As a result, in the semiconductor element 2C, the electric field concentration at the edge part of the gate electrode 30 is further suppressed as compared with the semiconductor element 2A. Accordingly, in the semiconductor element 2C, the ON-resistance increase due to the current collapse and the reliability deterioration are further suppressed as compared with the semiconductor element 2A.

(Third Variation Example of the Second Embodiment)

Figure 7:
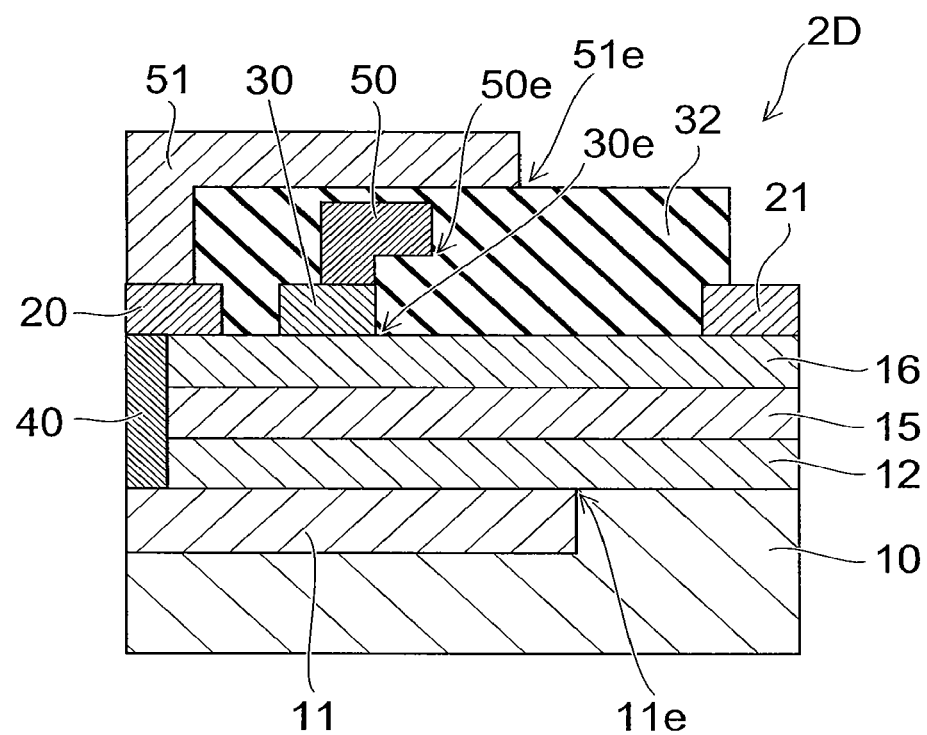
FIG. 7 is a schematic cross-sectional view of a semiconductor element according to a third variation example of the second embodiment.

FIG. 7 is a schematic cross-sectional view of a semiconductor element according to a third variation example of the second embodiment.

In the semiconductor element 2D, the source field plate electrode 51 is provided on the gate field plate electrode 50 via the passivation film 32.

The edge 11e of the p-type layer 11 on the drain electrode 21 side is positioned between the source field plate electrode 51 and the drain electrode 21 when viewed in the direction perpendicular to the major surface of the support substrate 10. That is, the edge 11e of the p-type layer 11 in the semiconductor element 2D is positioned closer to the drain electrode 21 than the edge 11e of the p-type layer 11 in the semiconductor element 2C.

In such a structure, when a high voltage is applied between the source electrode 20 and the drain electrode 21, the electric field is concentrated preferentially at the edge part of the p-type layer 11 as compared with the semiconductor element 2C. Therefore, in the semiconductor element 2D, the electric field at the edge part of the gate electrode 30 is further reduced as compared with the semiconductor element 2C. As a result, in the semiconductor element 2D, the current collapse is further suppressed as compared with the semiconductor element 2C.

Since the p-type layer 11 is positioned between the support substrate 10 and the buffer layer 12, the electric field is stronger within the semiconductor layer than on the element surface. As a result, the avalanche breakdown does not occur easily on the element surface, and a higher avalanche withstand capability and reliability are obtained.

(Third Embodiment)

Figure 8A:
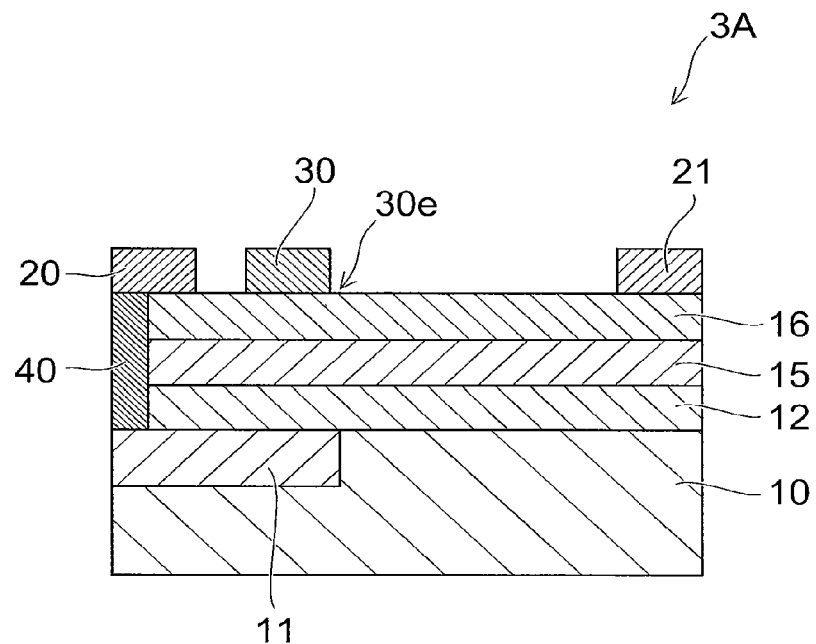
FIGS. 8A and 8B are schematic views of a semiconductor element according to a third embodiment.
Figure 8B:
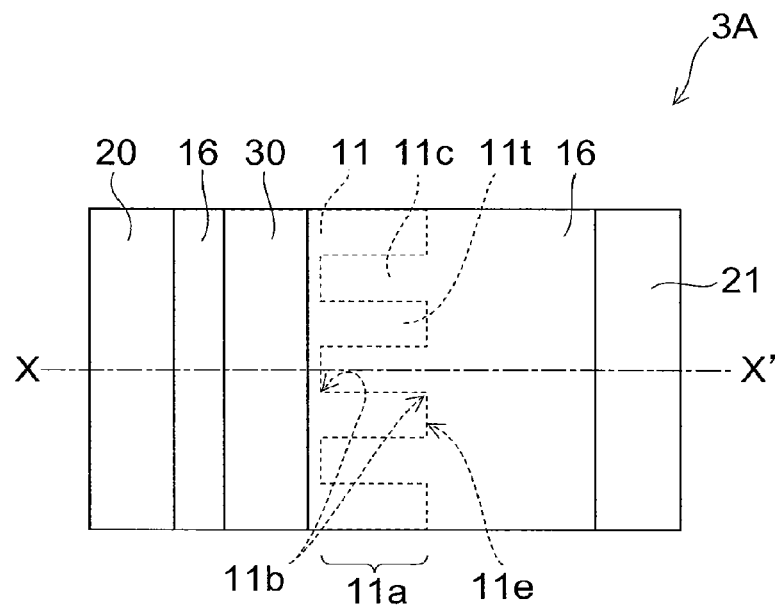

FIGS. 8A and 8B are schematic views of a semiconductor element according to a third embodiment, and FIG. 8A is a schematic cross-sectional view of the relevant part and FIG. 8B is a schematic plan view of the relevant part.

In the semiconductor element 3A, the p-type later 11 has a comb shape when viewed in the direction perpendicular to the major surface of the support substrate 10 (refer to FIG. 8B). At least one of concave parts 11c directed from the drain electrode 21 side toward the source electrode 20 side is provided at the edge part 11a of the p-type layer 11 on the drain 21 side. For example, the p-type layer 11 has a convex part 11t and the concave part 11c when viewed in the direction perpendicular to the major surface of the support substrate 10. A planar shape of the convex part 11t (or concave part 11c) is rectangular. The convex parts 11t (or concave parts 11c) are disposed periodically in a direction approximately perpendicular to the direction from the source electrode 20 to the drain electrode 21.

Therefore, the positions of the electric field concentration are dispersed the same as in the case of providing a plurality of field plate electrodes and the case of changing the length of the field plate electrode. For example, when a high voltage is applied between the source electrode 20 and the drain electrode 21, the electric field is dispersed into a plurality of corners 11b each formed by the convex part 11t and the concave part 11c. Furthermore, the positions of the electric field concentration are dispersed also when the convex part 11t of the p-type layer 11 is positioned near to the drain electrode 21, and thus the semiconductor element 3A maintains a high breakdown voltage. As a result, in the semiconductor element 3A, the ON-resistance increase due to the current collapse and the reliability deterioration are suppressed even when the element surface does not have the field plate structure.

(Variation Example of the Third Embodiment)

Figure 9:
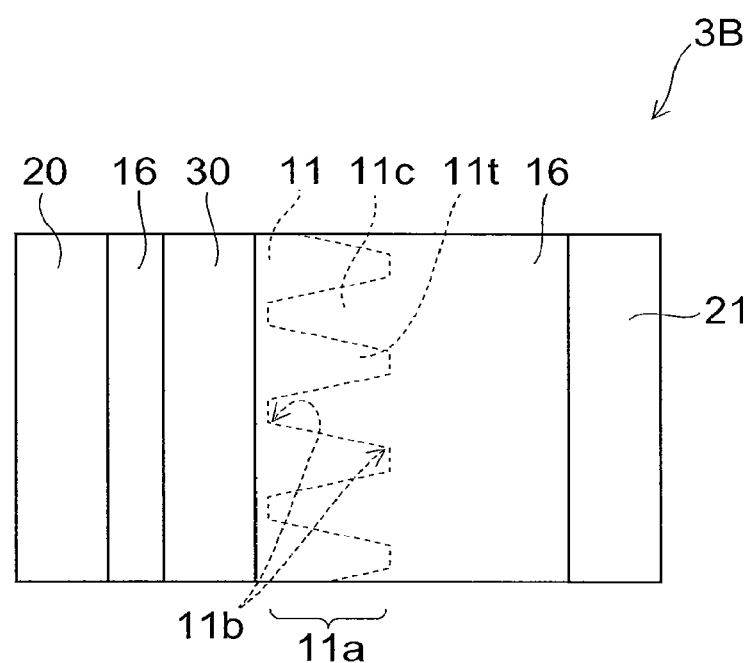
FIG. 9 is a schematic plan view of semiconductor element according to a variation example of the third embodiment.

FIG. 9 is a schematic plan view of a semiconductor element according to a variation example of the third embodiment.

In the semiconductor element 3B, a planer shape of the convex part 11t (or concave part 11c) is trapezoidal when viewed in the direction perpendicular to the surface of the support substrate 10. Also in such a planer shape, an advantage similar to that of the semiconductor element 3A is obtained.

Each of the HFET elements explained above is provided with a gate electrode through the use of the Schottky junction. This structure has a structure similar to a lateral-type Schottky barrier diode (SBD) between the gate and the drain. Accordingly, the HFET element of the embodiment can be diverted to the lateral-type SBD and this lateral type SBD has a low on-voltage and a high reliability.

(Fourth Embodiment)

Figure 10A:
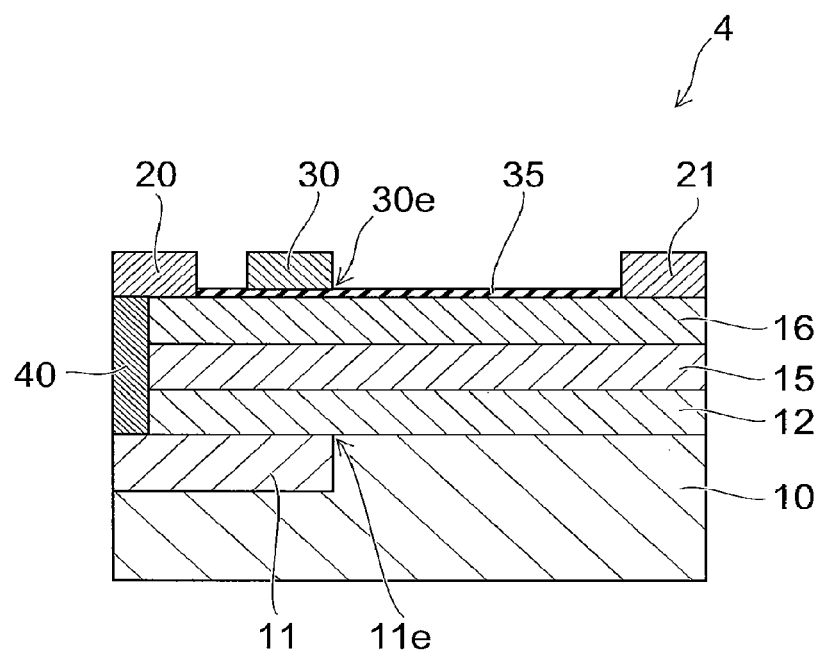
FIGS. 10A and 10B are schematic views of a semiconductor element according to a fourth embodiment.
Figure 10B:
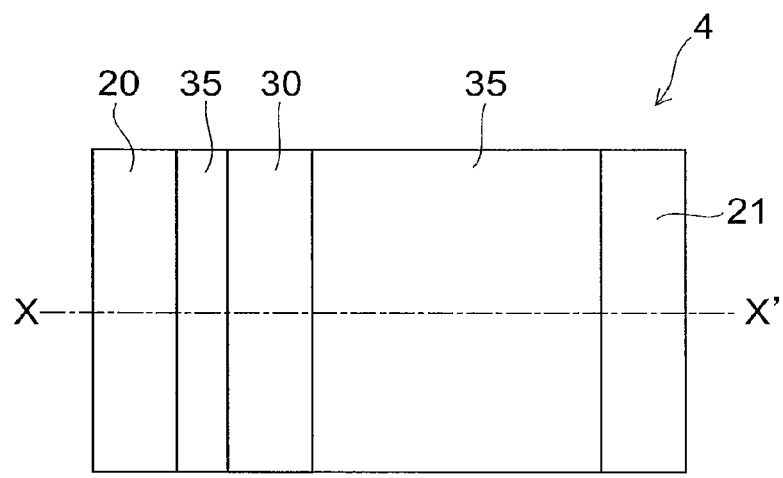

FIGS. 10A and 10B are schematic views of a semiconductor element according to a fourth embodiment, and FIG. 10A is a schematic cross-sectional view of the relevant part and FIG. 10B is a schematic plan view of the relevant part. FIG. 10A shows an X-X' cross section of FIG. 10B.

The semiconductor element 4 has an insulating gate structure. In the semiconductor element 4, a gate insulating film 35 is provided on the barrier layer 16. The material of the gate insulating film 35 is silicon oxide ($SiO_2$), silicon nitride ($Si_3N_4$), or the like, for example. The gate electrode 30 is provided on the gate insulating film 35 between the source electrode 20 and the drain electrode 21. The other configuration is the same as that of the semiconductor element 1A. A similar advantage to that of the semiconductor element 1A is obtained also in such a semiconductor element 4.

(Fifth Embodiment)

Figure 11A:
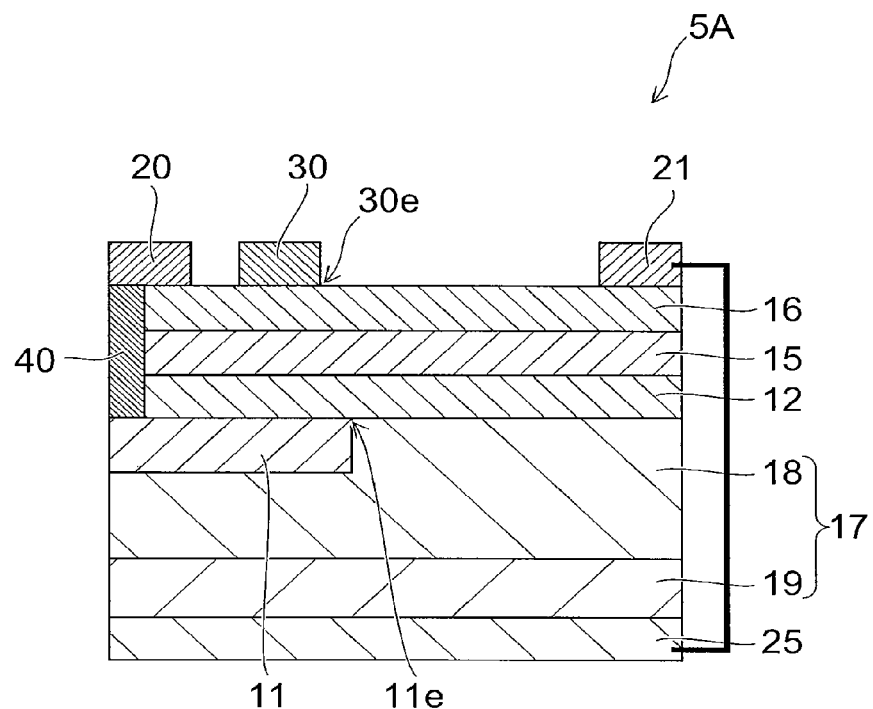
FIGS. 11A and 11B are schematic views of a semiconductor element according to a fifth embodiment.
Figure 11B:
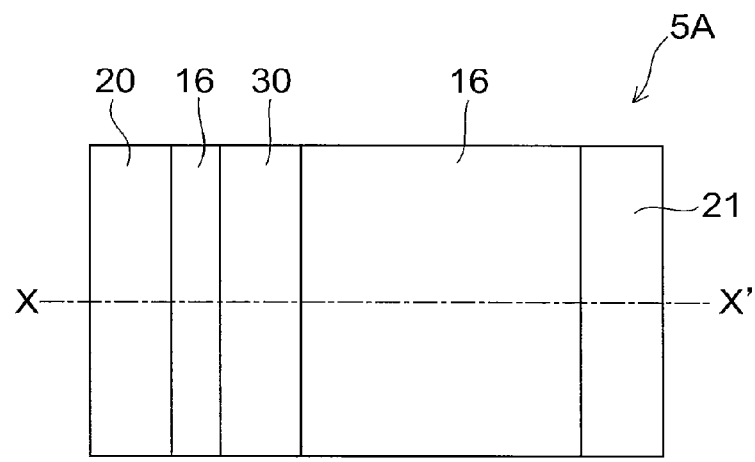

FIGS. 11A and 11B are schematic views of a semiconductor element according to a fifth embodiment, and FIG. 11A is a schematic cross-sectional view of the relevant part and FIG. 11B is a schematic plan view of the relevant part. FIG. 11A shows an X-X' cross section of FIG. 11B.

The semiconductor element 5A uses a Si substrate 17 as the support substrate. A major component of the Si substrate is silicon (Si). Preferably, in the Si substrate 17, a low-concentration layer 18 has a doping concentration not higher than $1 \times 10^{14}$ cm$^{-3}$ in order to have a high resistance. While the conduction type of the low-concentration layer 18 is a p-type as an example, the conductivity type may be an n-type.

The p-type layer 11 is provided on the surface of the Si substrate 17, and the p-type layer 11 is electrically connected to the source electrode 20. An n-type layer 19 is provided on a major surface (second major surface) opposite to the major surface (first major surface) of the Si substrate 17 where the p-type layer 11 is provided. Furthermore, the n-type layer 19 is connected with a rear-side electrode 25. The n-type layer 19 is connected to the drain electrode 21 via the rear-side electrode.

Silicon (Si) has a smaller critical electric field than gallium nitride (GaN). Therefore, when a high voltage is applied, the avalanche breakdown occurs easily in the p-type layer 11, the low-concentration layer 18, and the n-type layer 19 within the silicon substrate 17.

Accordingly, in the semiconductor element 5A, a high breakdown voltage is realized by way of increasing the distance between the p-type layer 11 and the drain electrode 21. Moreover, the thickness of the channel layer 15 can be reduced. Then, the avalanche breakdown is positively caused to occur within the Si substrate 17 and thus the avalanche breakdown does not occur easily in the channel layer 15

Furthermore, the p-type layer 11 is electrically connected to the source electrode 20 and the n-type layer 19 is electrically connected to the drain electrode via the rear-side electrode 25. Thereby, a large number of holes and electrons are generated only within the Si substrate 17 and the carriers are ejected quickly to the source electrode 20 and the drain electrode 21. Accordingly, a high avalanche withstand capability can be realized in the semiconductor element 5A.

Furthermore, the end 11e of the p-type layer 11 may be positioned closer to the drain electrode 21 side than the edge 30e of the gate electrode 30. Thereby, the electric field concentration is positively caused at the edge 11e of the p-type layer 11 and the avalanche breakdown occurs surely within the Si substrate 17. At the same time, the electric field concentration is suppressed at the edge 30e of the gate electrode 30 and the current collapse is suppressed in the semiconductor element 5A.

(First Variation Example of the Fifth Embodiment)

Figure 12:
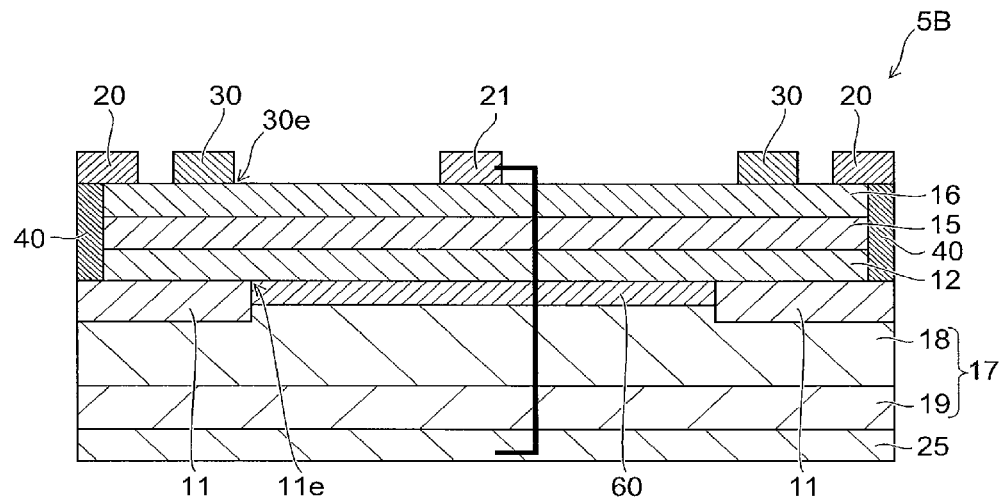
FIG. 12 is a schematic cross-sectional view of a semiconductor element according to a first variation example of the fifth embodiment.

FIG. 12 is a schematic cross-sectional view of a semiconductor element according to a first variation example of the fifth embodiment.

In the semiconductor element 5B, a low-concentration p-type layer 60 is provided on the surface of the Si substrate 17 between the neighboring p-type layers 11. In other words, in addition to the p-type layer 11, another p-type layer 11 is provided on the surface of the Si substrate 17, and the p-type layer 60 is provided on the surface of the Si substrate 17 in a part sandwiched by the p-type layer 11 and the another p-type layer 11. The low-concentration p-type layer 60 is depleted by the application of a high voltage. Thereby, the electric field concentration is suppressed at the edge 11e of the p-type layer 11. Accordingly, a high breakdown voltage is obtained in the semiconductor element 5B even when the distance between the p-type layer 11 and the drain electrode 21 is reduced. That is, the trade-off whether the breakdown voltage improvement or the ON-resistance reduction is relaxed in the semiconductor element 5B and a low ON-resistance is obtained at the same breakdown voltage.

(Second Variation Example of the Fifth Embodiment)

Figure 13:
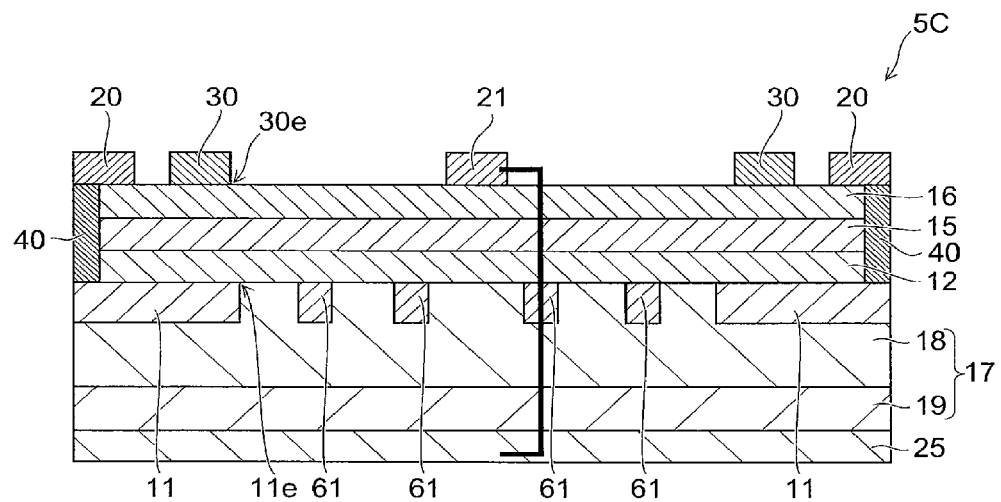
FIG. 13 is a schematic cross-sectional view of a semiconductor element according to a second variation example of the fifth embodiment.

FIG. 13 is a schematic cross-sectional view of a semiconductor element according to a second variation example of the fifth embodiment.

In the semiconductor element 5C, a plurality of p-type layers 61 are provided selectively on the surface of the Si substrate 17 between the neighboring p-type layers 11. In other words, in addition to the p-type layer 11, another p-type layer 11 is provided on the surface of the Si substrate 17, and the plurality of p-type layers 61 are provided on the surface of the Si substrate 17 in a part sandwiched by the p-type layer 11 and the another p-type layer 11. Thereby, the electric field 1 concentration is suppressed at the edge 11e of the p-type layer and a high breakdown voltage is obtained in the semiconductor element 5C. That is, the trade-off whether the breakdown voltage improvement or the ON-resistance reduction is relaxed in the semiconductor element 5C and a low ON-resistance is obtained at the same breakdown voltage.

The above described advantage is obtained also when the impurity concentration in the p-type layer 61 is the same as the impurity concentration in the p-type layer 11. Accordingly, the p-type layer 11 and the p-type layer 61 can be formed in the same manufacturing process. The number of the p-type layers 61 may be plural or singular.

That is, in FIG. 12 or 13, at least one of p-type layers (e.g., p-type layer 60 or p-type layer 61) is provided between the neighboring p-type layers 11. The p-type layer provided between the neighboring p-type layers is referred to as a second first-conductivity-type layer.

(Third Variation Example of the Fifth Embodiment)

Figure 14:
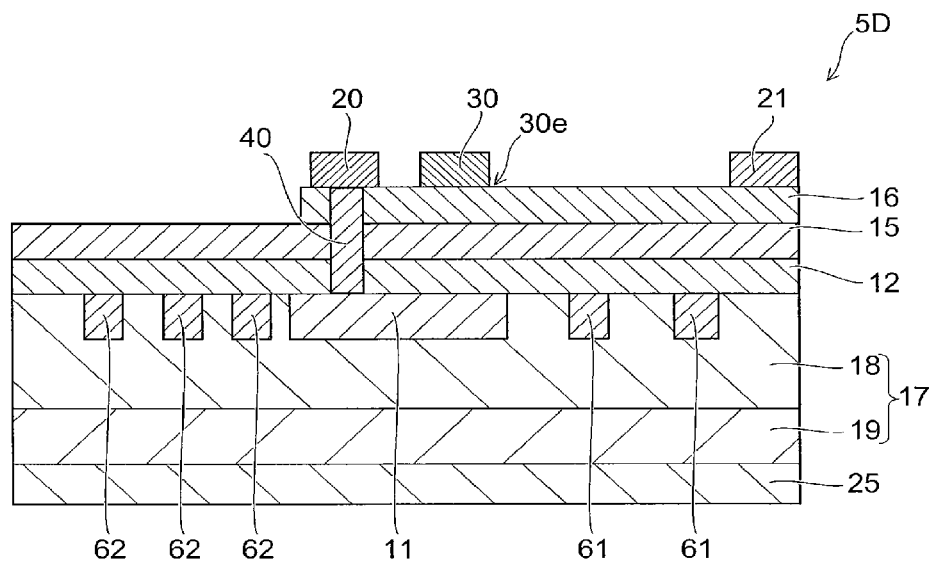
FIG. 14 is a schematic cross-sectional view of a semiconductor element according to a third variation example of the fifth embodiment.

FIG. 14 is a schematic cross-sectional view of a semiconductor element according to a third variation example of the fifth embodiment.

In the semiconductor element 5D, when a region, where the source electrode 20, the gate electrode 30, and the drain electrode 21 are provided, is defined as a element region (e.g., region from the source electrode 20 to the drain electrode 21), a p-type guard ring layer 62 is provided selectively on the surface of the Si substrate 17 in the outer periphery of the element region. That is, at least one of p-type guard ring layers 62, which is a third first-conductivity-type layer, is provided on the surface of the Si substrate 17 except a region where the p-type layer 11 or the p-type layer 61 is provided. Thereby, in the semiconductor element 5D, the avalanche breakdown is suppressed in the element outer peripheral, and a high breakdown voltage and a high avalanche withstand capability are realized.

The p-type guard ring layer 62 and the p-type layer 61 can be formed in the same manufacturing process as the p-type layer 11. Furthermore, preferably the spacing between the p-type guard ring layers 62 is smaller than the spacing between the p-type layers 11 and the spacing between the p-type layer 11 and the p-type layer 61 for preventing a breakdown voltage reduction in the element region outer peripheral.

Furthermore, the barrier layer 16 is not provided on the p-type guard ring layer 62. That is, in a part of the outer peripheral of the element region, the barrier layer 16 is not provided for preventing the generation of the two-dimensional electron gas.

(Fourth Variation Example of the Fifth Embodiment)

Figure 15:
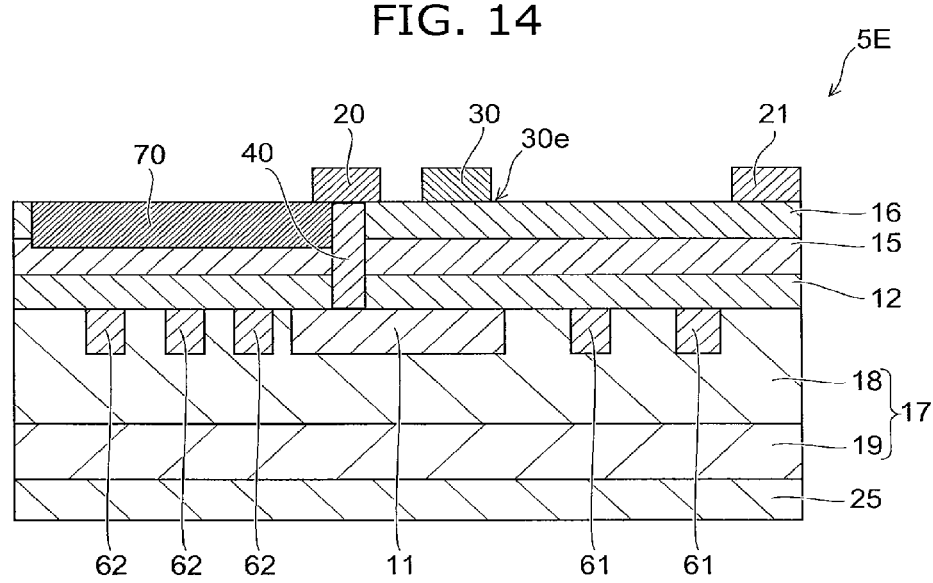
FIG. 15 is a schematic cross-sectional view of a semiconductor element according to a fourth variation example of the fifth embodiment.

FIG. 15 is a schematic cross-sectional view of a semiconductor element according to a fourth variation example of the fifth embodiment.

In the semiconductor element 5E, an element separation layer 70 is provided in the element outer peripheral region where the p-type guard ring layer 62 is provided. The element separation layer 70 is provided on the channel layer 15 on the p-type guard ring layer 62. The element separation layer 70 digs into a part of the surface of the channel layer 15. That is, the barrier layer 16 is not provided in a part of the element outer peripheral region for preventing the generation of the two-dimensional electron gas.

The element separation layer 70 can be formed by way of ion-implanting nitrogen, oxygen, boron, iron, or the like, for example. Furthermore, since the buffer layer 12 and the channel layer 15 are formed on the p-type guard ring layer 62, the surface of the Si substrate 17 is not exposed and the semiconductor element 5E obtains a high reliability.

Hereinabove, the embodiments are not limited to the above described examples and can be practiced by various modifications in a range without departing from the purport of the embodiments. For example, while AlGaN layer/GaN layer are illustrated as a combination of the barrier layer/the channel layer, the embodiments can be practiced also by GaN layer/InGaN layer, AlN layer/AlGaN layer, InAlN layer/GaN layer, or the like.

Furthermore, the embodiments can be practiced also when the gate structure is changed to a recess gate structure or the like, other than the Schottky gate electrode and the insulating gate structure. In the embodiments, the semiconductor conductivity type may be described as the p-type is the first-conductivity-type and the n-type is the second-conductivity-type.

In the description, "nitride semiconductor" is defined to include all the semiconductors having respective compositions which are obtained by changing composition ratios x, y, and z within respective ranges in a chemical formula $B_xIn_yAl_zGa_{1-x-y}N$ ($0 \leq x \leq 1$, $0 \leq y \leq 1$, $0 \leq z \leq 1$, $x+y+z \leq 1$). In addition, "nitride semiconductor" is defined to include a semiconductor further containing a V-group element except N (nitrogen) in the above chemical formula, a semiconductor further containing various kinds of element added for controlling various kinds of material property such as a conductivity type, and a semiconductor further containing various kinds of element which are not contained intentionally.

Hereinabove, the embodiments of the invention have been explained with reference to the specific examples. However, the invention is not limited to these specific examples. That is, any embodiments in which one skilled in the art adds a design change optionally to these specific examples are included within the scope of the invention to the extent that the feature of the invention is provided. Each element with which each of the above-described specific examples is provided and the arrangement, material, condition, shape, size and the like thereof are not limited to those of the illustrations and can be changed optionally.

Furthermore, the respective elements of the above described embodiments can be combined with one another to the extent of technical capability, and embodiments combining these elements are included within the scope of the invention to the extent that the feature of the invention is included.

Moreover, one skilled in the art would be able to arrive at various kinds of variation example and modification example in the scope of the philosophy of the invention and these variation examples and the modification examples are understood to be included within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor element, comprising:
   a semi-insulating substrate;
   a first first-conductivity-type layer having a first conductivity type and provided selectively on a first surface of the semi-insulating substrate;
   a first semiconductor layer provided on the semi-insulating substrate and the first first-conductivity-type layer, the first semiconductor layer containing $Al_XGa_{1-X}N$ ($0 \leq X < 1$);
   a second semiconductor layer provided on the first semiconductor layer and containing $Al_YGa_{1-Y}N$ ($0 < Y \leq 1$ and $X < Y$) that is not of the first conductivity type;
   a first major electrode connected to the second semiconductor layer;
   a second major electrode connected to the second semiconductor layer; and
   a control electrode provided on the second semiconductor layer between the first major electrode and the second major electrode,
   the first first-conductivity-type layer being disposed at a position under the control electrode in a first direction orthogonal to the first surface, the first first-conductivity-type layer having a first vertical side edge that is at a position between the control electrode and the second major electrode when viewed from the first direction.

2. The element according to claim 1, further comprising:
   a first insulating film provided on a first portion of a surface of the second semiconductor layer that is between the control electrode and the first major electrode and a second portion of the surface of the second semiconductor layer that is between the control electrode and the second major electrode; and
   a first field plate electrode provided on the first insulating film, wherein
   the first field plate electrode is connected to the control electrode, and the first vertical side edge of the first first-conductivity-type layer is positioned between the first field plate electrode and the second major electrode when viewed from the first direction.

3. The element according to claim 1, further comprising:

a first insulating film provided on a first portion of a surface of the second semiconductor layer that is between the control electrode and the first major electrode and a second portion of the surface of the second semiconductor layer that is between the control electrode and the second major electrode; and a first field plate electrode provided on the first insulating film, a second insulating film above the first field plate electrode in the first direction; and a second field plate electrode provided on the second insulating film, wherein the first field plate electrode is connected to the control electrode, the second field plate electrode is connected to the first major electrode, and the first vertical side edge of the first first-conductivity-type layer is positioned between the second field plate electrode and the second major electrode when viewed from the first direction.

4. The element according to claim 1, wherein the first vertical side edge of the first first-conductivity-type layer has a comb shape when viewed from the first direction.

5. The element according to claim 1, further comprising a gate insulating film provided between the second semiconductor layer and the control electrode.

6. The element according to claim 1, wherein the semi-insulating substrate is made of silicon.

7. The element according to claim 6, wherein a second first-conductivity-type layer having the first conductivity type is provided on the first surface of the semi-insulating substrate spaced from the first first-conductivity-type layer, and a third first-conductivity-type layer having the first conductivity type is provided on the first surface of the semi-insulating substrate between the first first-conductivity-type layer and the second first-conductivity-type layer.

8. The element according to claim 7, wherein an impurity concentration in the third first-conductivity-type layer is less than an impurity concentration in the first first-conductivity-type layer.

9. The element according to claim 6, wherein a second-conductivity-type layer having a second conductivity type that is opposite to the first conductivity type is provided on a second surface of the semi-insulating substrate that is opposite to the first surface of the semi-insulating substrate, and the second-conductivity-type layer is electrically connected to the second major electrode.

10. The element according to claim 7, wherein a fourth first-conductivity-type layer having the first conductivity type is provided on the first surface of the semi-insulating substrate surrounding a region in which the first major electrode, the second major electrode, and the control electrode are disposed when viewed from the first direction, and the first first-conductivity-type layer being within the region.

11. The element according to claim 10, wherein the second semiconductor layer is not provided between the fourth first-conductivity-type layer and the region when viewed from the first direction.

12. The element according to claim 10, wherein a device separation layer is provided on the first semiconductor layer above the fourth first-conductivity-type layer in the first direction.

* * * * *